(12) United States Patent
Woodford et al.

(10) Patent No.: US 9,282,636 B2
(45) Date of Patent: Mar. 8, 2016

(54) CONTACT PAD CARRIER STRIP AND METHOD FOR MAKING SAME

(71) Applicant: Johnson Electric S.A., Murten (CH)

(72) Inventors: Anthony Woodford, Newport (GB); Calvin Linfield, Newport (GB); Vincent Daniel Jean Salle, Newport (GB); Kenneth Senior, Newport (GB)

(73) Assignee: JOHNSON ELECTRIC S.A., Murten (CH)

( * ) Notice: Subject to any disclaimer, the term of this patent is extended or adjusted under 35 U.S.C. 154(b) by 115 days.

(21) Appl. No.: 13/893,899

(22) Filed: May 14, 2013

(65) Prior Publication Data

US 2013/0319733 A1 Dec. 5, 2013

(30) Foreign Application Priority Data

Jun. 5, 2012 (CN) .......................... 2012 1 0182012
Jul. 30, 2012 (CN) .......................... 2012 1 0265907

(51) Int. Cl.

| H05K 1/00 | (2006.01) |
|---|---|
| G06K 19/06 | (2006.01) |
| H05K 1/14 | (2006.01) |
| H05K 1/02 | (2006.01) |
| H05K 3/00 | (2006.01) |
| G06K 19/077 | (2006.01) |
| H05K 1/11 | (2006.01) |

(52) U.S. Cl.
CPC ........ *H05K 1/0296* (2013.01); *G06K 19/07743* (2013.01); *H05K 1/0266* (2013.01); *H05K 3/00* (2013.01); *H05K 1/118* (2013.01); *H05K 2201/09227* (2013.01); *Y10T 156/1089* (2015.01)

(58) Field of Classification Search
CPC .................................................. H05K 1/0296
USPC .......... 174/250, 254, 255, 257; 361/737, 749, 361/767; 235/492

See application file for complete search history.

(56) References Cited

U.S. PATENT DOCUMENTS

| 4,048,438 | A | * | 9/1977 | Zimmerman ................. 174/254 |
|---|---|---|---|---|
| 4,835,846 | A | * | 6/1989 | Juan et al. ........................ 29/840 |
| 4,949,155 | A | * | 8/1990 | Tajima et al. ................. 174/255 |
| 5,023,751 | A | * | 6/1991 | Stampfli ....................... 361/751 |
| 5,598,032 | A | * | 1/1997 | Fidalgo ......................... 257/679 |
| 6,479,756 | B2 | * | 11/2002 | Saito ............................ 174/250 |
| 2006/0139901 | A1 | * | 6/2006 | Meireles et al. .............. 361/760 |
| 2011/0101105 | A1 | * | 5/2011 | (Schropf) Grundwurmer et al. ............................. 235/488 |

FOREIGN PATENT DOCUMENTS

| CN | 102360447 A | 2/2012 |
|---|---|---|
| JP | H0864914 | 3/1996 |
| JP | 2000207522 | 7/2000 |
| TW | M452394 | 5/2013 |

* cited by examiner

*Primary Examiner* — Sherman Ng
(74) *Attorney, Agent, or Firm* — Muncy, Geissler, Olds & Lowe, P.C.

(57) ABSTRACT

A contact pad carrier strip includes a substrate having a lateral extent of or substantially of 35 mm or a multiple of or substantially of 35 mm, and at least three smart card contact pads formed along the lateral extent of the substrate. The contact pads are aligned widthwisely across the lateral extent of the substrate. Each smart card contact pad includes a plurality of contacts. A majority of contacts of the contact pads are oriented to extend widthwisely across the lateral extent of the carrier strip.

18 Claims, 4 Drawing Sheets

CONTACT PAD CARRIER STRIP AND METHOD FOR MAKING SAME

CROSS REFERENCE TO RELATED APPLICATIONS

This non-provisional patent application claims priority under 35 U.S.C. §119(a) from Patent Application No. 201210182012.1 filed in The People's Republic of China on Jun. 5, 2012 and Patent Application No. 201210265907.1 filed in The People's Republic of China on Jul. 30, 2012.

FIELD OF THE INVENTION

This invention relates to a method of forming smart card contact pads, and to a contact pad carrier strip formed using such a method.

BACKGROUND OF THE INVENTION

A so-called 'smart card' utilises an antenna or a contact pad having a set of physical metal, usually gold, contacts along with a small embedded microcontroller. The smart card is usually used as the card itself, for example, in the case of SIM cards for mobile telecommunications devices, or mounted to a larger substrate, such as in the case of credit or payment cards and identification cards.

The contact pads must be dimensioned correctly and typically to ISO7816 in order for the readers, such as a payment terminal or security card reader, into which the smart card is insertable to form the correct electrical connection. However, such a contact pad utilises precious metals, such as gold, so as to be compatible with assembly processes during production of the larger substrates to which the smart card is mounted. The cost of raw materials is increasing along with demand, but it is prohibitively expensive to the industry to implement different materials along with the re-qualification activity required in order to verify the robustness, longevity and security of any new arrangement.

The present invention therefore seeks to provide an improved smart card carrier strip on which more smart card contact pads can be formed whilst utilising the same amount of material for the carrier strip.

SUMMARY OF THE INVENTION

Accordingly, in one aspect thereof, the present invention provides a method of making a contact pad carrier strip, comprising steps of: a) providing a substrate having a width of or substantially of 35 mm or a multiple of or substantially of 35 mm in a lateral direction thereof; and b) forming at least three smart card contact pads on the substrate in the lateral direction thereof, the contact pads being aligned widthwisely in the lateral direction of the substrate.

Preferably, a multiple of three smart card contact pads are formed in the lateral direction of the substrate.

Preferably, a lateral size of the contact pad carrier strip is or is substantially 70 mm, six or seven smart card contact pads being formed in the lateral direction of the contact pad carrier strip.

Preferably, in step b), a majority of contacts of the contact pads are oriented to extend widthwisely in the lateral direction of the substrate.

Preferably, the contact pads are sized to or substantially to a minimum international standard for smart card contact pad width and/or length.

Preferably, the international standard is ISO7816 or 4FF Nano-SIM.

Preferably, the smart card contact pads are oriented lengthwisely in parallel with a longitudinal extent of the substrate.

Preferably, the smart card contact pads are aligned in rows which are parallel or substantially parallel with each other and with a longitudinal direction of the carrier strip.

According to a second aspect, the present invention provides a contact pad carrier strip comprising a substrate having a lateral extent of or substantially of 35 mm or a multiple of or substantially of 35 mm, and at least three smart card contact pads formed along the lateral extent of the substrate, the contact pads being aligned widthwisely across the lateral extent of the substrate.

Preferably, each smart card contact pad comprises a plurality of contacts, at least a majority of contacts of the contact pads being oriented to extend widthwisely across the lateral extent of the carrier strip.

Preferably, each contact pad includes eight contacts in two groups of four contacts, the two groups being arranged to extend in a longitudinal direction of the carrier strip, and the four contacts of each group being arranged to extend in a lateral direction of the carrier strip.

Preferably, the substrate is flexible.

Preferably, a lateral extent of the substrate is or is substantially 70 mm, six or seven smart card contact pads being formed in the contact pad carrier strip across the lateral direction thereof.

Preferably, the contact pads are lengthwisely oriented to extend in parallel or substantially parallel with a longitudinal extent of the substrate.

Preferably, the contact pads are aligned lengthwisely along a longitudinal extent of the substrate in at least three rows or a multiple of three rows.

Preferably, the contact pads are aligned widthwisely along a lateral extent of the substrate in a plurality of rows extending along the longitudinal extent of the substrate.

Preferably, the contact pads are sized to or substantially to a minimum international standard for smart card contact pad width and/or length.

Preferably, the international standard is ISO7816 or 4FF Nano-SIM.

BRIEF DESCRIPTION OF THE DRAWINGS

Preferred embodiments of the invention will now be described, by way of example only, with reference to figures of the accompanying drawings. In the figures, identical structures, elements or parts that appear in more than one figure are generally labelled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
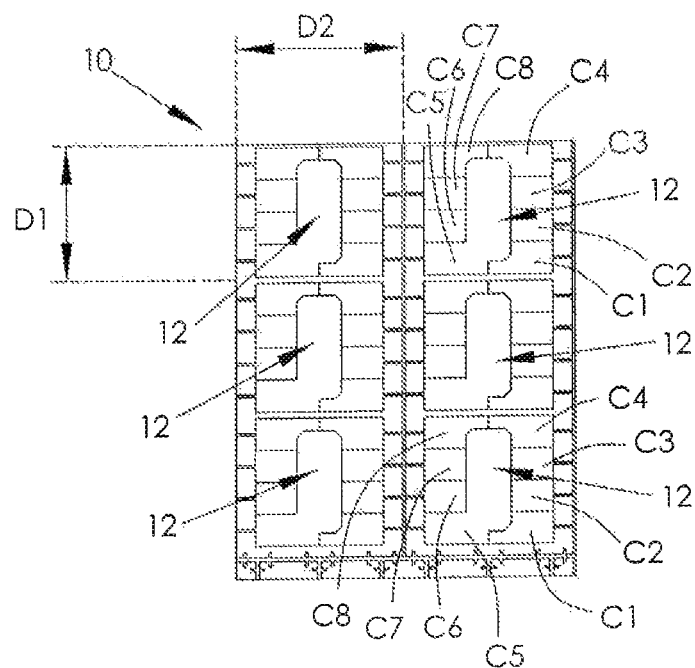
FIG. 1 shows a portion of a contact pad carrier strip in accordance with a first embodiment of the present invention.
Figure 2:
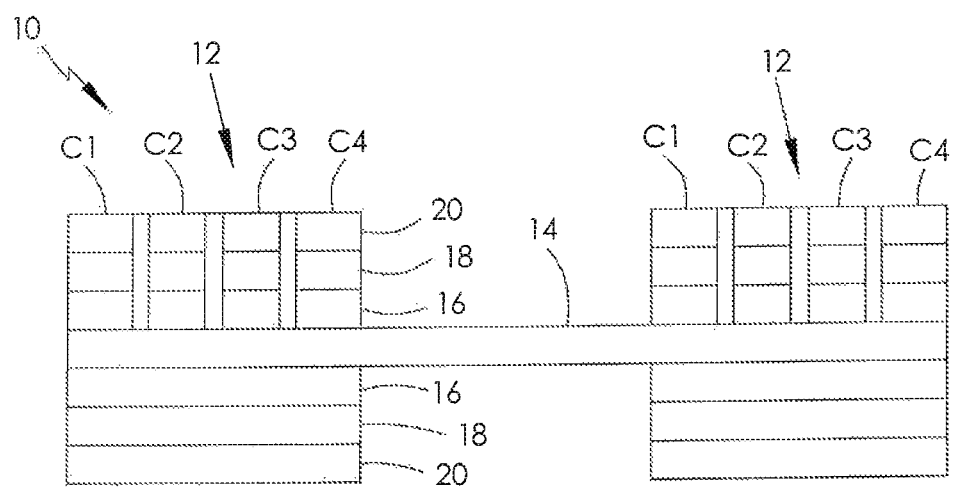
FIG. 2 is a cross-sectional view of a portion of the carrier strip of FIG. 1 in a lateral direction thereof.

FIGS. 1 to 2 illustrate a carrier strip 10 in accordance with a first embodiment of the present invention. The carrier strip 10 comprises a plurality of smart card contact pads 12 formed thereon. Each smart card contact pad 12 comprises a plurality of contacts, in this embodiment being eight corresponding to: Contact 1 C1, known as VCC, is utilised for power connection through which operating power is supplied to the microprocessor chip in the card; Contact 2 C2, known as RST, is utilised as a reset line through which an interface device can signal to a microprocessor chip of the smart card to initiate its reset sequence of instructions; Contact 3 C3, known as CLK, is the clock signal line through which a clock signal can be provided to the microprocessor chip, controlling the operation speed and providing a common framework for data communication between the interface device and an integrated circuit card; Contact 4 C4, known as RFU, is presently reserved for future use; Contact 5 C5, known as GND, is the ground line providing common electrical ground between the interface device and the integrated circuit card; Contact 6 C6, also known as VPP, provides a programming power connection used to program EEPROM of first generation integrated circuit cards; Contact 7 C7, also denoted as I/O, is an input/output line that provides a half-duplex communication channel between the reader and the smart card; and Contact 8 C8, is also an RFU, which is reserved for future use. Contacts 1 through 8 may be reconfigured to provide alternative functions or the functions may be interchanged as necessity dictates.

As shown in FIG. 2, the carrier strip 10 further comprises a substrate 14 which is preferably formed from a flexible plastics base layer 14, such as PET. The substrate 14 generally has a thickness in the range of 55 microns to 95 microns, and more preferably a thickness which is or is substantially 75 microns.

The contact pad 12 comprises a pair of first electrically conductive layer 16, a pair of second electrically conductive layer 18 and a pair of third electrically conductive layer 20. The first electrically conductive layers 16 are respectively coated on opposite sides of the base layer 14. In this embodiment, the first electrically conductive layer 16 is made of copper. The thickness of the first electrically conductive layer 16 is preferably in the range of 5 microns to 25 microns, and more preferably 10 microns or approximately 10 microns.

The second electrically conductive layers 18, in this embodiment being made of nickel, overlies both first electrically conductive layers 16. The second electrically conductive layer 18 preferably has a thickness in the range of 1.0 micron to 4 microns, and more preferably 2.5 microns or approximately 2.5 microns.

The third electrically conductive layers 20 which may also called outer electrically conductive layer 20, overlies both second electrically conductive layers 18. In this embodiment, the third electrically conductive layer 20 is made of gold. The third electrically conductive layer 20 preferably has a thickness in the range of 0.02 microns to 0.08 microns, and more preferably 0.045 microns or approximately 0.045 microns.

The contacts C1 to C8 of each contact pad 12 are preferably etched, and in this embodiment a wet etching process may be conveniently utilised.

The perimeter dimensions of the contact pad 12, and preferably each contact C1 to C8, are set to a minimum or substantially minimum dimension required by international standard ISO7816. In this embodiment, a preferred distance between centres of contacts C4 and C8 is 7.62 mm, and a preferred distance between centres of contacts C1 and C4 is 7.62 mm. Preferably, a primary contact area of at least each contact C1 to C4 and C6 to C8 is 1.7 mm by 2.0 mm. Each contact pad 12 is oriented to extend widthwisely across a lateral extent of the carrier strip 10. More particularly, at least the contacts C1 to C4 and C6 to C8 are preferably oriented to extend widthwisely across the lateral extent of the carrier strip 10. In this regard, contact C1 to contact C4 of each contact pad 12 extend side by side in the lateral direction of the carrier strip 10, and similarly contact C5 to contact C8 of each contact pad 12 also extend side by side in the lateral direction of the carrier strip 10. In this embodiment, the first group of contacts C1 to C4 are formed upstream of the second group of contacts C5 to C8 on the carrier strip 10, or vice versa as necessity dictates.

The first group of contacts C1 to C4 of each contact pad 12 aligned in the lateral direction of the carrier strip 10 are aligned with each other, and similarly the second group of contacts C5 to C8 of each contact pad 12 aligned in the lateral direction of the carrier strip 10 are also aligned with each other. The width D1 of the contact pad 12 is not greater than the length D2 of the contact pad 12.

By forming each contact pad 12 on the carrier strip 10 oriented so that its longitudinal extent extends in parallel with the longitudinal extent of the carrier strip 10 and/or the longitudinal extents of at least the majority of the contacts C1 to C8 extend in parallel with the longitudinal extent of the carrier strip 10, at least three or a multiple of three contact pads 12 can be formed on the carrier strip 10 across the lateral extent thereof.

In this embodiment, the carrier strip 10 has a 35 mm lateral width formed from a larger blank to match current roll to roll manufacturing processes. As such, minimal modification is required to existing production techniques, and the end consumer is not subjected to any new processes, testing or regulation of the resulting contact pads 12.

With a 35 mm lateral extent, three redimensioned and widthwisely oriented contact pads 12 can be aligned in columns extending laterally across the carrier strip 10. Multiple such columns are arranged in parallel with each other over the longitudinal extent of the carrier strip 10.

Once removed from the carrier strip 10, for example, by stamping, each contact pad 12 can be individually mounted to a suitable carrier to form a required contact smart card.

Figure 3:
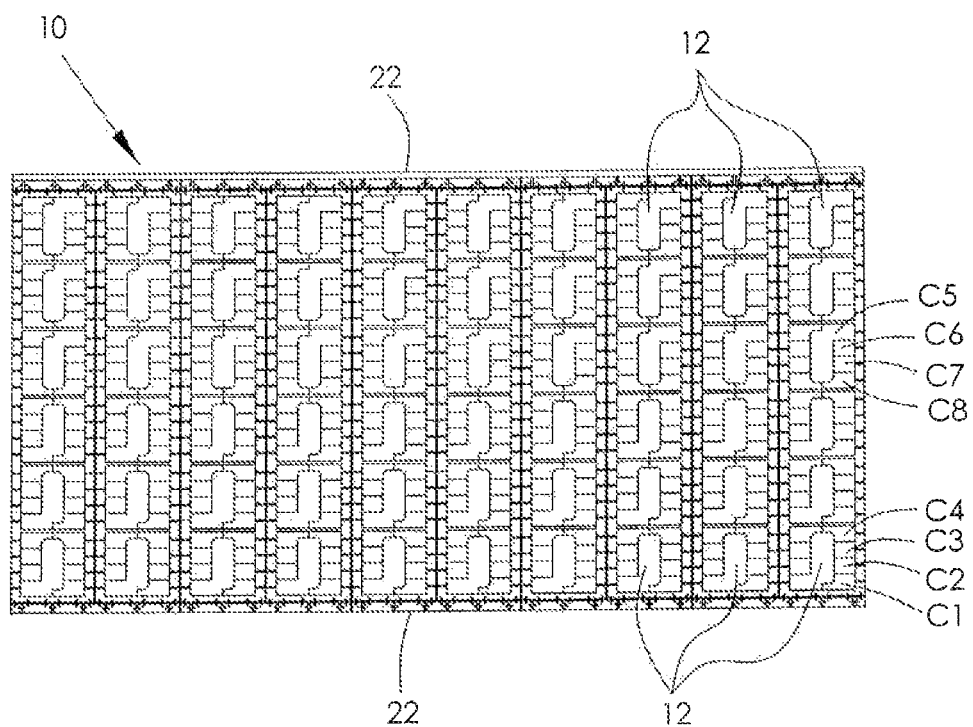
FIG. 3 shows a portion of a contact pad carrier strip in accordance with a second embodiment of the present invention.

With minimal further modification, and with reference to FIG. 3, a second embodiment of a contact pad carrier strip 10 is possible. References which are similar or identical to those of the first embodiments refer to like parts, and further detailed description is therefore omitted.

To improve utilisation of materials and productivity, a lateral extent of the carrier strip 10 is increased from 35 mm to 70 mm, thereby allowing six widthwisely oriented contact pads 12 to be formed during the production process across the lateral extent of the carrier strip 10. The contact pads 12 are thus aligned laterally and longitudinally in rows on the carrier strip 10, similar to the first embodiment.

As shown in FIG. 3, the orientation of certain longitudinal rows of contact pads 12 may be reversed.

Widths beyond 70 mm may be considered, and preferably these are multiples of 35 mm or substantially 35 mm.

Locating holes 22 are required along the longitudinal edges of the carrier strip 10 during a chip mounting stage of production. As such, by utilising a carrier strip 10 of 70 mm lateral extent, the hole punching device and the drive sprockets of these units must be reconfigured. No other modification to the industry standard machinery is however required.

Figure 4:
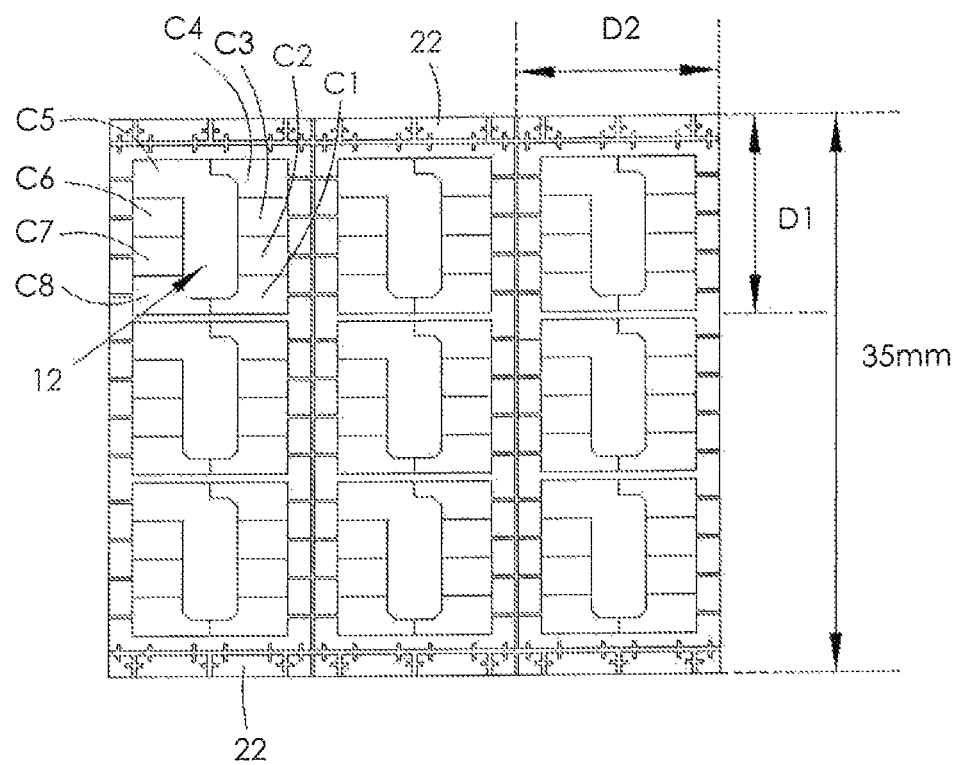
FIG. 4 shows a portion of a contact pad carrier strip in accordance with a third embodiment of the present invention.
Figure 5:
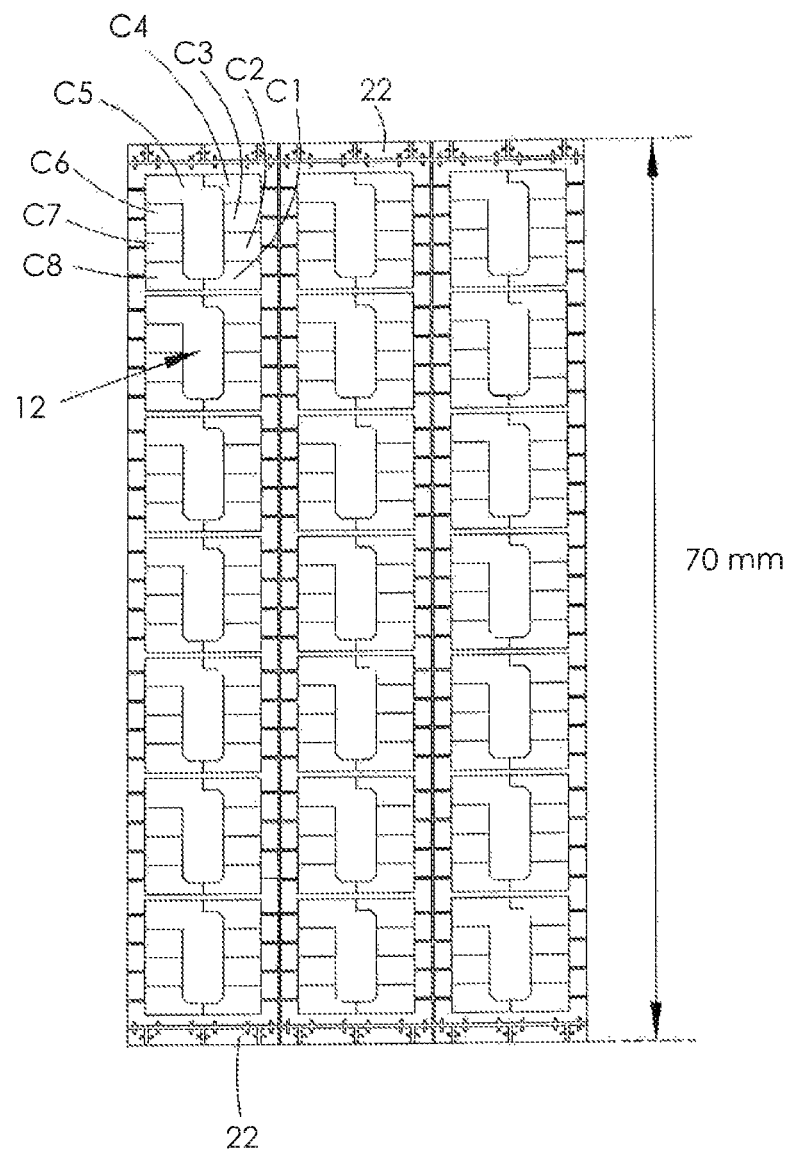
FIG. 5 shows a portion of a contact pad carrier strip in accordance with a fourth embodiment of the present invention.

FIGS. 4 and 5 show contact pad carrier strips 10 in accordance with third and fourth embodiments of the present invention. In the third and fourth embodiments, the perimeter dimensions of the contact pad 12, and preferably each contact C1 to C8, are set to a minimum or substantially minimum dimension required by international standard 4FF Nano-SIM. The width D1 of the contact pad 12 is substantially 8.8 mm±0.1 mm and the length of D2 of the contact pad 12 is substantially 12.3 mm±0.1 mm. Thus, it is easily to arrange three contact pads 12 widthwisely across the lateral extent of the carrier strip 10 with a 35 mm lateral width, as shown in FIG. 4. Two rows of locating holes 22 may be formed at opposite longitudinal edges of the carrier strip 10. As shown in FIG. 5, seven contact pads 12 may be arranged widthwisely across the lateral extent of the carrier strip 10 with a 70 mm lateral width. Two rows of locating holes 22 may be formed at opposite longitudinal edges of the carrier strip 10.

It is possible to better utilise the raw materials of the carrier strip, enabling more contact pads to be produced whilst utilising the same amount of material for the carrier strip. Furthermore, by increasing the width of the carrier strip, the number of longitudinal strips formed from a blank of the carrier strip material is reduced. This improves production time allowing a greater number of contact pads to be formed in a given period.

In the description and claims of the present application, each of the verbs "comprise", "include", "contain" and "have", and variations thereof, are used in an inclusive sense, to specify the presence of the stated item but not to exclude the presence of additional items.

Although the invention is described with reference to one or more preferred embodiments, it should be appreciated by those skilled in the art that various modifications are possible. Therefore, the scope of the invention is to be determined by reference to the claims that follow.

The invention claimed is:

1. A method of making a contact pad carrier strip, comprising:
   providing a substrate having a width of or substantially of 35 mm or a multiple of or substantially of 35 mm in a lateral direction thereof; and
   forming six or seven physically separable smart card contact pads on the substrate in the lateral direction thereof, the contact pads being aligned widthwisely in the lateral direction of the substrate,
   wherein each smart card contact pad comprises a plurality of contacts.

2. The method of claim 1, wherein a multiple of three smart card contact pads are formed in the lateral direction of the substrate.

3. The method of claim 1, wherein a lateral size of the contact pad carrier strip is or is substantially 70 mm.

4. The method of claim 1, wherein, in said forming at least three smart card contact pads, a majority of contacts of the contact pads are oriented to extend widthwisely in the lateral direction of the substrate.

5. The method of claim 1, wherein the contact pads are sized to or substantially to a minimum international standard for smart card contact pad width and/or length.

6. The method of claim 5, wherein the international standard is ISO7816 or 4FF Nano-SIM.

7. The method of claim 1, wherein the smart card contact pads are oriented lengthwisely in parallel with a longitudinal extent of the substrate.

8. The method of claim 1, wherein the smart card contact pads are aligned in rows which are parallel or substantially parallel with each other and with a longitudinal direction of the carrier strip.

9. A contact pad carrier strip comprising:
   a substrate having a lateral extent of or substantially of 35 mm or a multiple of or substantially of 35 mm; and
   six or seven physically separable card contact pads formed along the lateral extent of the substrate, the contact pads being aligned widthwisely across the lateral extent of the substrate,
   wherein each smart card contact pad comprises a plurality of contacts.

10. The contact pad carrier strip of claim 9, wherein at least a majority of the contacts of the contact pads being oriented to extend widthwisely across the lateral extent of the carrier strip.

11. The contact pad carrier strip of claim 9, wherein each contact pad includes eight contacts in two groups of four contacts, the two groups being arranged to extend in a longitudinal direction of the carrier strip, and the four contacts of each group being arranged to extend in a lateral direction of the carrier strip.

12. The contact pad carrier strip of claim 9, wherein the substrate is flexible.

13. The contact pad carrier strip of claim 9, wherein a lateral extent of the substrate is or is substantially 70 mm.

14. The contact pad carrier strip of claim 9, wherein the contact pads are lengthwisely oriented to extend in parallel or substantially parallel with a longitudinal extent of the substrate.

15. The contact pad carrier strip of claim 9, wherein the contact pads are aligned lengthwisely along a longitudinal extent of the substrate in at least three rows or a multiple of three rows.

16. The contact pad carrier strip of claim 9, wherein the contact pads are aligned widthwisely along a lateral extent of the substrate in a plurality of rows extending along the longitudinal extent of the substrate.

17. The contact pad carrier strip of claim 9, wherein the contact pads are sized to or substantially to a minimum international standard for smart card contact pad width and/or length.

18. The contact pad carrier strip of claim 17, wherein the international standard is ISO7816 or 4FF Nano-SIM.

* * * * *